(12) United States Patent
Boudreaux

(10) Patent No.: US 7,347,713 B2
(45) Date of Patent: Mar. 25, 2008

(54) ALIGNMENT SYSTEM

(75) Inventor: Brent Boudreaux, Highland Village, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/185,595

(22) Filed: Jul. 20, 2005

(65) Prior Publication Data

US 2007/0020984 A1 Jan. 25, 2007

(51) Int. Cl.
*H01R 13/64* (2006.01)

(52) U.S. Cl. ...................... 439/374; 439/342

(58) Field of Classification Search ........... 439/266, 439/341, 342, 374, 372, 376
See application file for complete search history.

(56) References Cited

U.S. PATENT DOCUMENTS

| | | | | |
|---|---|---|---|---|
| 4,075,444 A | * | 2/1978 | Hollingsead et al. | .... 200/51.09 |
| 4,236,190 A | * | 11/1980 | Hollingsead et al. | ....... 361/725 |
| 4,981,440 A | * | 1/1991 | Werner et al. | ............... 439/266 |
| 5,057,031 A | * | 10/1991 | Sinclair | ....................... 439/261 |
| 5,306,172 A | * | 4/1994 | Inada et al. | .................. 439/299 |
| 6,244,888 B1 | * | 6/2001 | Cappe | ......................... 439/341 |
| 6,356,454 B1 | * | 3/2002 | Braunlich et al. | ........... 361/784 |
| 2001/0018285 A1 | | 8/2001 | Mizumura | |
| 2001/0018286 A1 | | 8/2001 | Mizumura | |
| 2003/0186577 A1 | | 10/2003 | Ma | |

* cited by examiner

*Primary Examiner*—James Harvey

(57) ABSTRACT

A socket alignment system comprising a receiving member disposed adjacent to a socket that is operable to receive an electronic component. A slot is disposed on the receiving member and has a longitudinal axis therethrough. An alignment member extends from an electronic component. The alignment member comprises a lower portion and an upper portion. The lower portion is operable to interface with the slot and prevent movement of the electronic component along the longitudinal axis. The upper portion is operable to interface with the slot and allow translational movement of the electronic component along the longitudinal axis.

25 Claims, 4 Drawing Sheets

ALIGNMENT SYSTEM

BACKGROUND

Many types of connectors are used to couple electronic components to computer systems. One type of connector used for multi-pin components is a low, or zero, insertion force connector. This type of connector comprises a socket that allows the pins of an electronic device to be inserted into an array of receptacles on the socket with little or no force. A portion of the socket then translates to engage the pins in a shearing action. Once the pins are engaged, the electronic component is secured to the socket and electrically coupled to the computer system.

As the electronic device is seated onto the socket, the alignment between the pins and the receptacles is important. Even a slight misaligned can result in damage to the pins. Aligning the electronic device to the socket is made difficult by the fact that the electronic component must be able to move as the socket translates to engage the pins. Therefore, any alignment feature must also allow for some translation of the electronic component. Further complicating the alignment of the pins and the receptacles is that in many instances, the person installing the electronic component can not see the interface between the pins and the receptacles.

BRIEF SUMMARY

The problems noted above are solved in large part by a socket alignment system comprising a receiving member disposed adjacent to a socket that is operable to receive an electronic component. A slot is disposed on the receiving member and has a longitudinal axis therethrough. An alignment member extends from an electronic component. The alignment member comprises a lower portion and an upper portion. The lower portion is operable to interface with the slot and prevent movement of the electronic component along the longitudinal axis. The upper portion is operable to interface with the slot and allow translational movement of the electronic component along the longitudinal axis.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
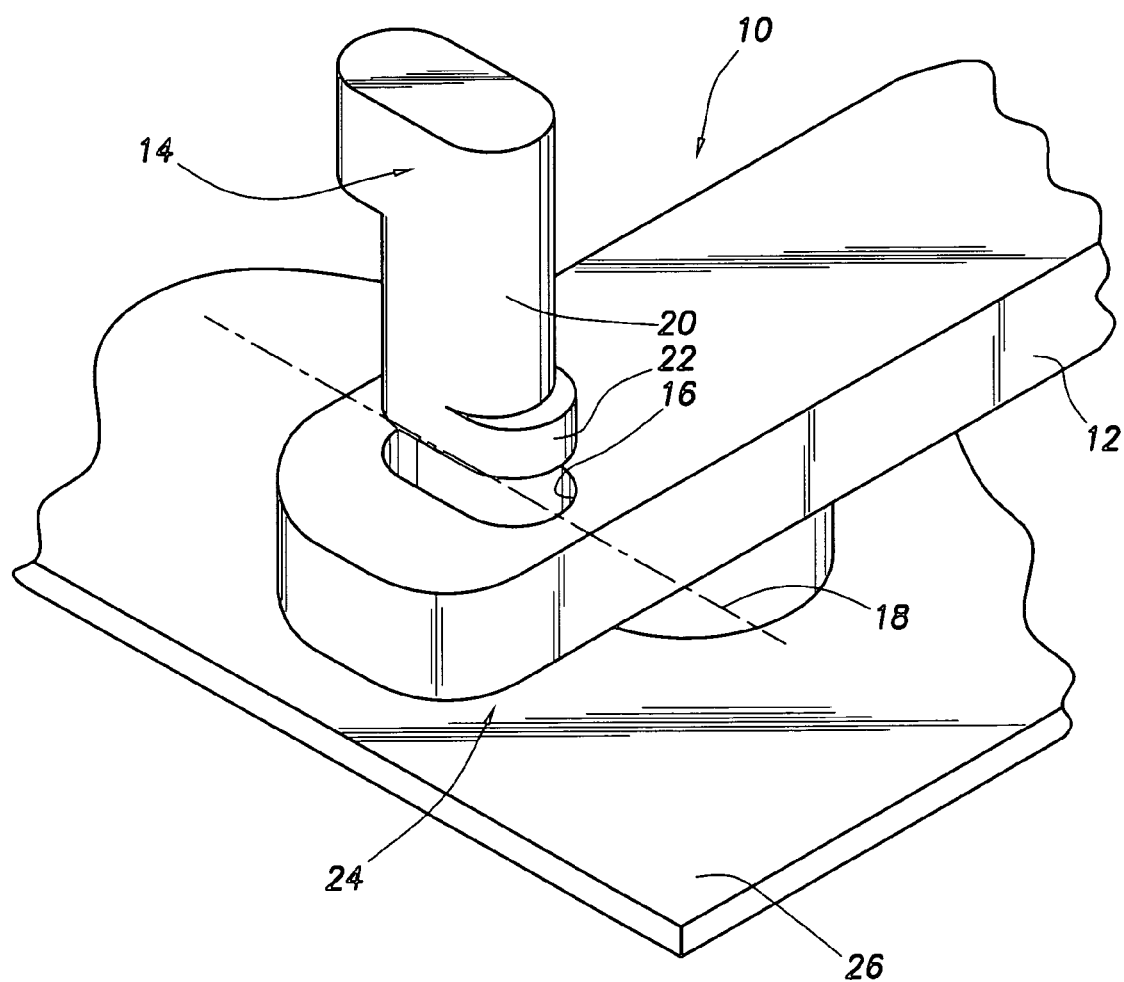
FIG. 1 shows an isometric view of an alignment system constructed in accordance with embodiments of the invention.

Referring now to FIG. 1, alignment system 10 comprises receiving member 12 and alignment member 14. Receiving member 12 comprises slot 16 having longitudinal axis 18. Alignment member 14 comprises upper portion 20 and lower portion 22, which projects beyond the upper portion and gives the alignment member a foot shape. Lower portion 22 is shaped so as to interface with slot 16 and prevent translational movement of alignment member 14 along longitudinal axis 18 when the lower portion is disposed within the slot. Once lower portion 22 passes through receiving member 12 and is disposed in void 24 between the receiving member and surface 26, upper portion 20 is sized so as to allow translational movement of alignment member 14 along longitudinal axis 18.

Figure 2:
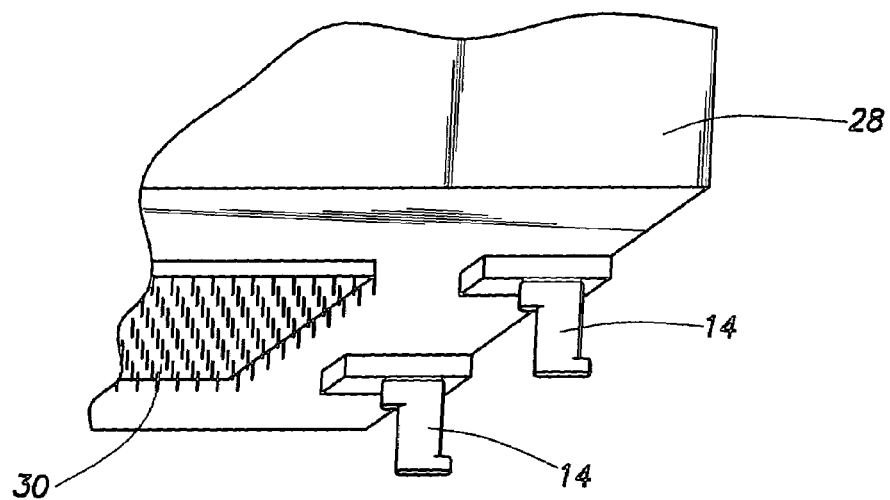
FIG. 2 shows an electronic component configured for use with an alignment system constructed in accordance with embodiments of the invention.

Referring now to FIG. 2, alignment members 14 are coupled to an electronic component 28, such as a processor assembly. A plurality of pins 30 projects from electronic component 28. Alignment members 14 project below the end of pins 30 so as to help prevent damage to the pins and to ensure that the pins are aligned with the socket before engaging the socket receptacles.

Figure 3:
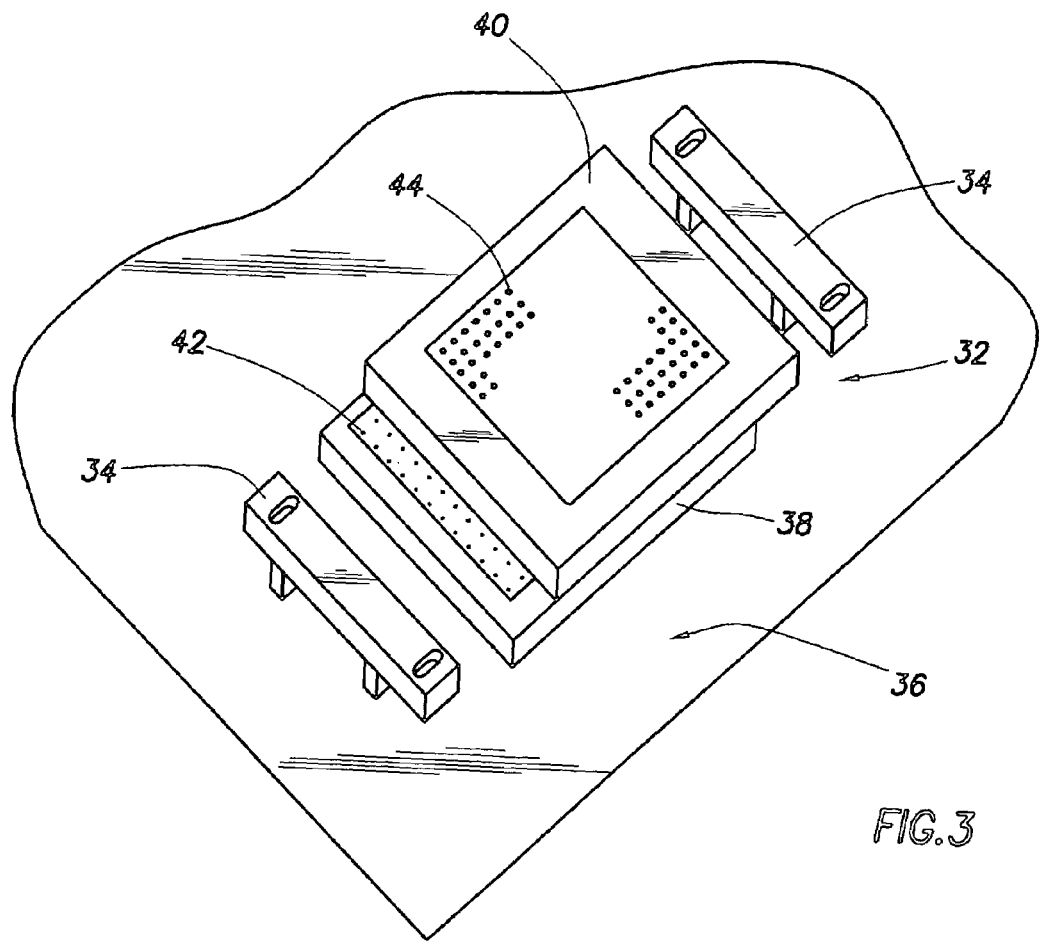
FIG. 3 shows a socket assembly configured for use with an alignment system constructed in accordance with embodiments of the invention.

One embodiment of a socket 32 and receiving members 34 is shown in FIG. 3. Socket 32 and receiving members 34 are mounted to printed circuit board 36. Socket 32 comprises a lower member 38 and an upper member 40 that can slide relative to lower member 38. Lower member 38 includes a plurality of contact members 42 coupled to circuit board 36. Upper member 40 includes a plurality of receptacles 44. Socket 32 has first position where upper member 40 is aligned with lower member 38 such that receptacles 44 are aligned with contact members 42. Socket 32 also has a second position where upper member 40 is offset from lower member 38 such that receptacles 44 are not aligned with contact members 42.

It is in the second position that the pins from an electronic assembly can be freely inserted into receptacles 44. Once the pins are engaged with receptacles 44, upper member 40 can be translated relative to lower member 38 so that the receptacles align with contact members 42 and the pins engage, and electrically couple to, the contact members. This procedure, as well as the operation of an alignment apparatus, is further described with reference to FIGS. 4-7.

FIGS. 4-7 illustrate the operation of alignment system 100 during the engagement of electronic component 102 with socket 104 that is mounted to printed circuit board 106. Alignment system 100 comprises receiving members 108 and corresponding alignment members 110. Receiving members 108 are mounted to printed circuit board 106 and comprise slots 112 having longitudinal axis 114 that are oriented in the direction in which socket 104 translates. Alignment members 110 are mounted to electronic component 102 and comprise upper portion 116 and lower portion 118, which projects beyond the upper portion. Electronic component 102 comprises pins 120 arranged so as to interface with receptacles 122 in upper member 124 of socket 104. Socket 104 also comprises lower member 126 having contact members 128 coupled to printed circuit board 106.

Figure 4:
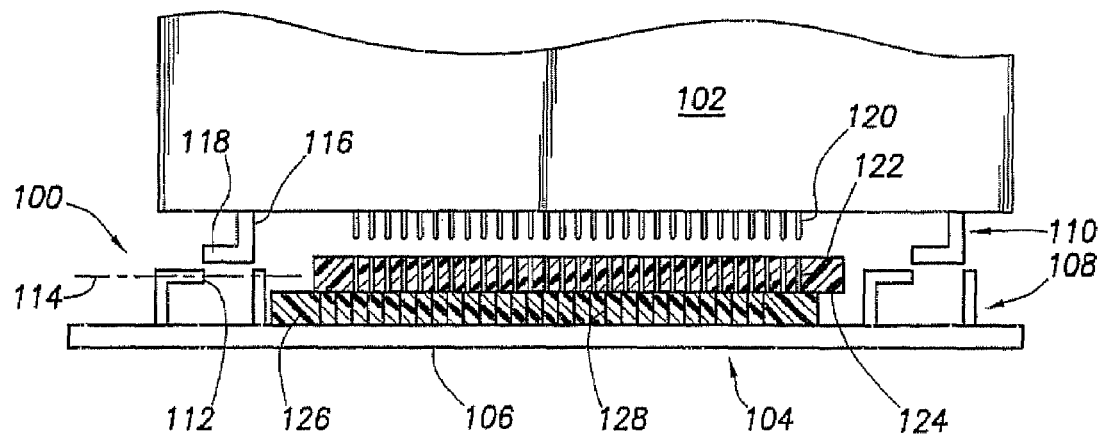
FIG. 4 shows a first step in engaging an electronic component with a socket using an alignment system constructed in accordance with embodiments of the invention.

As shown in FIG. 4, upper member 124 of socket 104 is offset from lower member 126 such that receptacles 122 are positioned to receive pins 120 of electronic component 102. As electronic component 102 is lowered toward socket 104, lower portions 118 of alignment member 110 are aligned with slots 112. Alignment members 110 and slots 112 are arranged such that the engagement of lower portions 118 and slots 112 aligns pins 120 with receptacles 122. Lower portions 118 are shaped so as to interface with slot 112 and prevent translational movement of alignment member 110 along longitudinal axis 114 when the lower portion is disposed within the slot.

Figure 5:
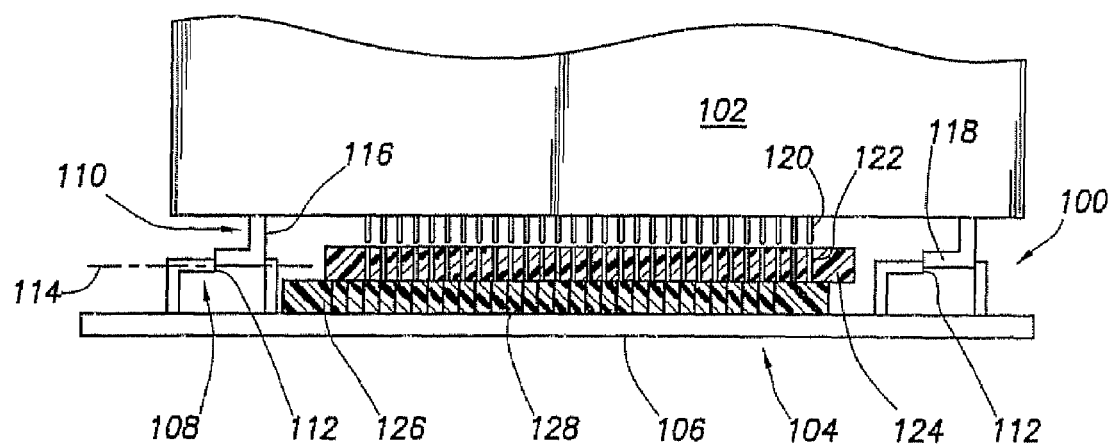
FIG. 5 shows a second step in engaging an electronic component with a socket using an alignment system constructed in accordance with embodiments of the invention.
Figure 6:
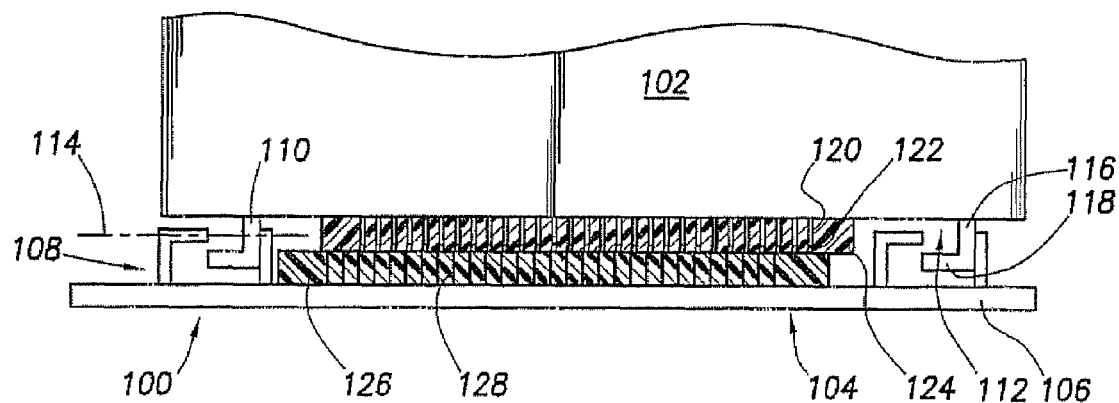
FIG. 6 shows a third step in engaging an electronic component with a socket using an alignment system constructed in accordance with embodiments of the invention.
Figure 7:
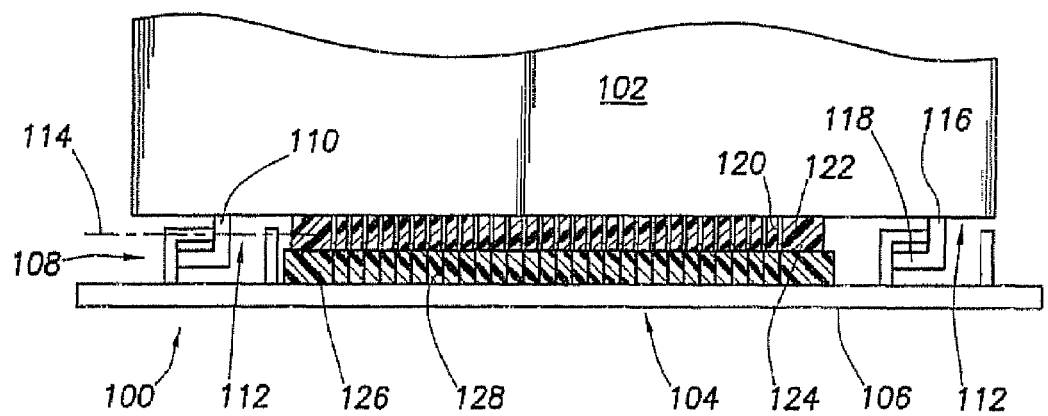
FIG. 7 shows a final step in engaging an electronic component with a socket using an alignment system constructed in accordance with embodiments of the invention.

Once alignment members 110 are engaged with slots 112, pins 120 are fully aligned with and can engage receptacles 122, as shown in FIG. 5. Electronic component 102 is further moved toward socket 104 until pins 120 are fully engaged with receptacles 122, as shown in FIG. 6. At this point, lower portions 118 of alignment members 110 have passed through slots 112 and are disposed between receiving members 108 and printed circuit board 106. Upper portions 116 are now disposed within slots 112 and translational movement of electronic component 102 along longitudinal axis 114 is allowed. Electronic component 102 is then electrically coupled to circuit board 106 by shifting upper member 124 so that pins 120 and receptacles 122 are aligned and coupled with contact members 128, as shown in FIG. 7. In this position, electronic component 102 is locked to socket 104.

Therefore, an alignment system constructed in accordance with embodiments of the invention allows a multi-pinned electronic component to be reliably aligned with a low insertion force socket. Although the embodiments shown above include a plurality of alignment members and receiving members it is understood that systems utilizing a single alignment member and slot are possible. Further the alignment member and slot can have any coordinating shape and configuration as may be desirable.

The above discussion is meant to be illustrative of the principles and various embodiments of the present invention. Numerous variations and modifications will become apparent to those skilled in the art once the above disclosure is fully appreciated. For example, embodiments of the alignment systems described herein could be used for other components and systems. It is intended that the following claims be interpreted to embrace all such variations and modifications.

What is claimed is:

1. A socket alignment system comprising:
   a receiving member disposed adjacent to a socket that is operable to receive an electronic component having a plurality of pins;
   a slot disposed on said receiving member, wherein said slot has a longitudinal axis therethrough; and
   an alignment member extending from the electronic component and beyond the pins, wherein said alignment member comprises:
      a lower portion operable to interface with said slot before said pins enter the socket and prevent translational movement of the electronic component along the longitudinal axis while said pins enter the socket; and
      an upper portion operable to interface with said slot and allow translational movement of the electronic component along the longitudinal axis after said pins have entered the socket;
   wherein the electronic component electrically couples to the socket as a result of the electronic component being translated along said longitudinal axis relative to the socket.

2. The socket alignment system of claim 1 wherein the socket and said receiving member are coupled to a printed circuit board.

3. The socket alignment system of claim 2 wherein the socket comprises:
   a lower member having a plurality of contact members coupled to the printed circuit board; and
   an upper member having a plurality of receptacles disposed therethrough, wherein said upper member is movable along the longitudinal axis of said slot between a first position and a second position, wherein the receptacles are aligned with the contact members in the first position and not aligned in the second position.

4. The socket alignment system of claim 3 wherein the electronic component comprises a plurality of pins arranged so as to interface with the plurality of receptacles, wherein, when the upper member is in the second position, the pins are aligned with the contact members so as to couple the electronic component to the printed circuit board.

5. The socket alignment system of claim 4 wherein
   the lower portion is operable to interface with said slot and prevent movement of the electronic component along the longitudinal axis prior to and during engagement of the pins and the receptacles; and
   the upper portion is operable to interface with said slot and allow movement of the electronic component along the longitudinal axis after the pins are fully engaged with the receptacles.

6. The socket alignment system of claim 5 wherein the pins are electrically coupled to the contact members when the pins are fully engaged with the receptacles.

7. The socket alignment system of claim 2 wherein said receiving member is elevated above the printed circuit board such that the first portion of the alignment member can be disposed between the receiving member and the printed circuit board.

8. The socket alignment system of claim 1 wherein the lower portion of the alignment member has an oval cross-section.

9. The socket alignment system of claim 1 wherein the alignment member has a foot shape.

10. A computer assembly comprising:
a printed circuit board;
a socket mounted to said printed circuit board and comprising:
   a lower member having a plurality of contact members coupled to said printed circuit board; and
   an upper member having a plurality of receptacles disposed therethrough, wherein said upper member is movable between a first position, wherein said plurality of receptacles align with the plurality of contact members, and a second position wherein said plurality of receptacles do not align with the plurality of contact members;
a receiving member fixably coupled to said printed circuit board;
a slot disposed on said receiving member and having a longitudinal axis therethrough;
an electronic component comprising a plurality of pins arranged so as to interface with the plurality of receptacles on said socket; and
an alignment member disposed on said electronic component, wherein said alignment member comprises:
   a lower portion operable to interface with said slot and align the plurality of pins with the plurality of receptacles when the upper member of said socket is in the second position; and
   an upper portion operable to interface with said slot and allow movement of the electronic component along the longitudinal axis of said slot as the upper member of said socket moves from the second position to the first position.

11. The computer assembly of claim 10 wherein said receiving member is elevated above said printed circuit board such that the first portion of the alignment member can be disposed between the receiving member and the printed circuit board.

12. The computer assembly of claim 10 wherein the upper portion of the alignment member has an oval cross-section.

13. The computer assembly of claim 12 wherein the lower portion of the alignment member has an oval cross-section that projects beyond the cross-section of the upper portion.

14. The computer assembly of claim 10 wherein the lower portion of said alignment member is disposed within said slot when the pins interface with the receptacles.

15. The computer assembly of claim 10 wherein the upper portion of said alignment member is disposed within said slot when the upper member of said socket moves to the first position.

16. An electronic component and socket engagement method comprising:
aligning a lower portion of a non-pivoting alignment member with a slot, the alignment member is projected beyond a plurality of pins on the electronic component;
engaging the slot with the lower portion of the alignment member so as to restrict movement of the electronic component relative to the socket along a longitudinal axis of the slot;
moving the lower portion of the alignment member through the slot so that the slot engages an upper portion of the alignment member; and
translating the electronic component relative to the socket along the longitudinal axis of the slot so as to electrically couple the electronic component to the socket.

17. The method of claim 16 further comprising engaging a plurality of pins disposed on the electronic component with a plurality of receptacles disposed on the socket after the lower portion of the alignment member engages the slot.

18. The method of claim 17 further comprising aligning the plurality of pins with a plurality of contacts disposed within the socket as the electronic component translates along the longitudinal axis of the slot.

19. The method of claim 16 wherein the socket and said receiving member are coupled to a printed circuit board.

20. The method of claim 16 wherein the receiving member is elevated above the printed circuit board such that the lower portion of the alignment member can be disposed between the receiving member and the printed circuit board when the upper portion is engaged with the slot.

21. The method of claim 16 wherein the upper portion of the alignment member has an oval cross-section.

22. The method of claim 16 wherein the lower portion of the alignment member has an oval cross-section that projects beyond the cross-section of the upper portion.

23. A system for aligning an electronic component to a socket, the system comprising:
alignment means that extends past a plurality of pins on the electronic component, the alignment means having a lower portion and an upper portion;
means for receiving the lower portion of the alignment means that prevents translation of the electronic component along a longitudinal axis; and
means for receiving the upper portion of the alignment means that allows for translation of the electronic component along the longitudinal axis;
wherein translation of the electronic component relative to the socket along said longitudinal axis causes the electronic component to electrically couple to the socket.

24. The socket alignment system of claim 23 further comprising means for electrically coupling the plurality of pins to a plurality of contact members within the socket as the electronic component is translated along the longitudinal axis.

25. The socket alignment system of claim 23 wherein said means for receiving the upper and lower portions of the alignment means are disposed adjacent to the socket on a motherboard.

* * * * *